(12) United States Patent
Kadomura et al.

(10) Patent No.: US 6,174,408 B1
(45) Date of Patent: Jan. 16, 2001

(54) METHOD AND APPARATUS FOR DRY ETCHING

(75) Inventors: Shingo Kadomura; Tomohide Jozaki; Shinsuke Hirano, all of Kanagawa (JP)

(73) Assignee: Sony Corporation, Tokyo (JP)

( * ) Notice: Under 35 U.S.C. 154(b), the term of this patent shall be extended for 0 days.

(21) Appl. No.: 09/371,369

(22) Filed: Aug. 10, 1999

Related U.S. Application Data (62) Division of application No. 08/804,412, filed on Feb. 21, 1997.

(30) Foreign Application Priority Data

Feb. 26, 1996 (JP) .................................................. 8-037691
Mar. 4, 1996 (JP) .................................................. 8-045868

(51) Int. Cl.[7] .................................................. H01L 21/00
(52) U.S. Cl. ........................ 156/345; 118/724; 118/723 R
(58) Field of Search .................................... 118/724, 725; 156/345; 165/80.2, 80.3

(56) References Cited

U.S. PATENT DOCUMENTS 5,085,750 * 2/1992 Soraoka et al. ...................... 156/345
5,810,933 * 9/1998 Mountsier et al. ................... 118/724
5,892,207 * 4/1999 Kawamura et al. .................. 118/724

* cited by examiner

Primary Examiner—Thi Dang
(74) Attorney, Agent, or Firm—Sonnenschein, Nath & Rosenthal

(57) ABSTRACT

An apparatus 1 for manufacturing a semiconductor device capable of actually putting the low temperature etching technique into practical use is also provided, having a vacuum chamber 2 in which a specimen stage 12 having a cooling means is disposed at the inside and a plasma generation means for generating plasmas, in which a specimen, for example, semiconductor substrate W is processed by generating plasmas while controlling the temperature of the specimen W placed on a specimen stage 12 by cooling the specimen stage 12 by a cooling means. The cooling means uses a liquefied gas or a gas as a coolant, the flow channel for the coolant is formed by arranging in parallel a plurality of pipelines 21a–21d having diameters different from each other at positions before flowing to the specimen stage, and the specimen stage 12 is cooled by flowing the coolant through the pipelines 21a–21d. The cooling means is provided with a control means 22 for controlling the amount of the coolant caused to flow to each of the plurality of pipelines 21a–21d respectively.

7 Claims, 4 Drawing Sheets

METHOD AND APPARATUS FOR DRY ETCHING

RELATED APPLICATION DATA

This application is a division of U.S. application Ser. No. 08/804,412 filed Feb. 21, 1997. The present and foregoing application claim priority to Japanese applications Nos. P08-037691 filed Feb. 26, 1996, and P08-045868 filed Mar. 4, 1996. The foregoing applications are incorporated herein by reference to the extent permitted by law.

BACKGROUND OF THE INVENTION

1. Field of the Invention

The present invention concerns a dry etching method used mainly for the production of semiconductor devices and, more in particular, it relates to a method and an apparatus for dry etching providing compatibility for anisotropic fabrication and high selectivity.

2. Description of the Related Art

In recent years, a demand for fine fabrication in super LSI has become severer and it is indispensable, for example, in etching treatment, a processing method of providing compatibility for fine fabrication at high accuracy with minimized dimensional conversion tolerance and high selectivity to underlying material.

However, in a case of plasma etching materials other than oxide films, an anisotropic shape has been ensured as is well-known by the presence of a so-called side wall protection film. The side wall protection film is formed by the deposition, on the side wall of a pattern of various deposits including organic polymers which are formed when reaction products formed during plasma etching are dissociated again in the plasmas and they serve to protect the side wall of the pattern and prevent the side wall from being etched.

By the way, since the side wall protection film is formed by the deposits from the reaction products, when a pattern formed by etching is convex and if the width of the pattern is fine, the thickness of the side wall protection wall is relatively increased excessively, making the width of the entire pattern larger than a desired width. In the same manner, when a pattern formed by etching is of a concave recess and if the width is narrow, the thickness of the side wall protection film is relatively increased excessively, making the entire pattern width narrower than a desired width. Accordingly, as various kinds of patterns have been made finer and the with of the pattern is made finer (narrowed) as described above, the dimensional accuracy of the obtained pattern is lowered when if it is intended to ensure the anisotropy of etching by utilizing the side wall protection film.

In order to overcome such a disadvantages, it has recently been attempted and attracted attention to apply etching while conducting exhaustion at high speed thereby ensuring a dimensional accuracy.

In the high speed exhaustion process, a pump of a higher exhaustion speed than that of existent etching apparatus is attached, and conductance of the etching gas is improved to, whereby the residence time of an etching gas during etching is shortened and dissociation of the reaction products in plasmas is suppressed during etching. According to the high speed exhaustion process, since the amount of deposits by redissociation of the reaction products can be decreased significantly, the absolute value for the dimensional conversion tolerance and variation thereof can be suppressed extremely effectively.

However, in the high speed exhaustion process described above, since the reaction products are exhausted rapidly, a supply source for the side wall protection film is decreased and the side wall protection film of a satisfactory thickness is not formed, the anisotropic shape can not be ensured enough, so that it results in an additional problem that the configurational accuracy of the pattern obtained upon applying overetching is worsened.

That is, if a bias applied to a substrate is lowered in order to ensure the selectivity relative to the underlying material, since the side wall protection film is thin and, accordingly, weak, occurrence of side etch or notching is inevitable. On the other hand, if the applied bias is increased in order to ensure the shape, selectivity relative to the underlying material is deteriorated.

As a technique capable of overcoming the problem that the selectivity and the shape are in a trade-off relation and capable of attaining both the selectivity and the anisotropic shape simultaneously, a so-called low temperature etching technique of cooling the wafer to a temperature lower than 0° C. during etching has been proposed.

The low temperature etching technique has been disclosed, for example, as an invention made by K. Tsujimoto in Proceedings of Symposium of Dry Process (Oct. 24–25, 1988, Tokyo), p.p. 42–49.

In this technique, radical reaction is suppressed by lowering the specimen temperature, so that anisotropy can be ensured even under a low substrate bias.

However, even the low temperature etching technique has the following disadvantages.

At first, fabrication is difficult to a material such as W polyside in which vapor pressures of reaction products are different. This is because the vapor pressure of reaction products such as $WCl_x$ and $WO_xCl_y$ formed upon etching of $WSi_x$ is low, etching for $WSi_x$ can not be applied if the temperature of the specimen is lowered to such a temperature as convenient for etching the polysilicon.

Secondly, deltaT (difference between a temperature set for a specimen stage and a wafer temperature) is increased upon etching. That is, although temperature lowering is effective for ensuring the selectivity relative to the underlying Si, for example, in the fabrication of contact holes, since temperature lowering results a contact hole of a tapered shape due to deposition of an excessive polymer, so that setting for the low temperature condition is difficult as described above and, in addition, incident energy has to be increased inevitably in order to disconnect Si—O bonds in the fabrication of contact holes, which results in the increase of deltaT.

Accordingly, because of the disadvantage described above, even the low temperature etching can be applied actually only at a halfway temperature. In order to overcome such a disadvantage, it may be considered to vary the setting temperature for a specimen comprising, for example, a wafer between etchings for materials having different vapor pressures of reaction products or between just etching and overetching. However, the temperature can not be changed within a short time in an existent cooling system by a chiller using a liquid such as fluorinate as a coolant and, accordingly, existent low temperature etching can not be practiced at a temperature to provide a sufficient effect inherent to the low temperature etching technique as described above.

SUMMARY OF THE INVENTION

It is an object of the present invention to provide a dry etching method capable of attaining both high selectivity and fine fabrication at high accuracy simultaneously, as well as an apparatus for manufacturing a semiconductor device capable of actually putting the low temperature etching technique into practical use.

In accordance with a dry etching method as a first aspect of the present invention, the foregoing object can be attained by applying an etching treatment comprising a plurality of steps to a specimen within an identical processing apparatus, wherein the temperature of the specimen is changed between etching in one step and etching in the succeeding step, thereby applying etching at temperature different between the one step and the succeeding step.

That is, according to the dry etching method, since the specimen temperature is changed between the etching in one step and etching in the succeeding step, if a main etching as the one step is applied at a normal temperature, and overetching as the succeeding step is conducted at a low temperature for instance, since radical reaction can be suppressed during overetching by temperature lowering even if the thickness of the formed side wall protection film is thin, so that it can endure resultant excessive radical attack. Accordingly, due to the radical reaction suppressing effect by the temperature lowering, even if the bias applied to the specimen is lowered, formation of undercut or notching can be prevented.

Further, since each of the etching treatments is conducted within an identical processing apparatus, the time for the change of the specimen temperature between the steps can be shortened.

Further, the foregoing object can be attained in a dry etching method in accordance with the second aspect of the present invention by applying an etching treatment comprising plurality of steps repeatedly to a plurality of specimens respectively in a dry etching method, wherein the method comprises changing the temperature of a specimen by changing the temperature of a specimen stage supporting the specimen between etching in the initial step and etching in the final step of the steps described above, applying etching at different temperatures between the initial step and the final step, and changing the temperature of the specimen stage to a setting temperature for the specimen in the etching at the initial step after the completion of the etching at the final step and before putting of a next specimen into the processing apparatus.

According to the dry etching method, since the etching treatment is conducted at temperatures different between the etching at the first step and etching at the final step, the same effect as in the first feature of the present invention can be obtained and, since the temperature of the specimen stage is changed to the setting temperature for the specimen in the etching at the initial step after the completion of the etching at the final step and before putting the next specimen in the identical processing apparatus, the time from the completion of etching for a specimen to the start of etching for the next specimen can be shortened.

Further, the foregoing object can be solved by an apparatus for producing a semiconductor device in accordance with third aspect of the present invention, having a vacuum chamber in which a specimen stage equipped with a cooling means is disposed at the inside and a plasma generation means disposed in the vacuum chamber for generating plasmas for processing a semiconductor substrate by generating plasmas while controlling the temperature of a semiconductor substrate placed on the specimen stage by cooling the specimen stage by the cooling means, wherein the cooling means uses a liquefied gas or a gas as a coolant, a flow channel of the coolant is formed by disposing in parallel a plurality of pipelines of different diameters at a position before flowing to the specimen stage, and the specimen stage is cooled by flowing the coolant through the pipelines to the specimen stage, and the cooling means has a control means disposed for controlling the flow rate of the coolant to each of the plurality of pipelines.

In the apparatus for producing the semiconductor device, since the temperature of the semiconductor substrate on the specimen stage is controlled (cooled) by using a coolant comprising a liquefied gas or a gas, more rapid cooling is possible as compared with an existent cooling method using a liquid as the coolant. That is, while it is basically desirable to supply a great amount of coolants at a temperature as low as possible for rapid temperature lowering, if the liquid is used for the coolant as usual, it is difficult to supply a great amount of the coolant since the viscosity thereof is increased at a low temperature failing to attain sufficient heat exchange. On the other hand, in the present invention, since a liquefied gas s or gas is used as the coolant as described above in the present invention, supply of a great amount of the coolant is not inhibited by the increase of the viscosity, so that the coolant can be supplied in a sufficient amount to enable rapid cooling to a desired temperature.

Further, since the flow channel of the coolant to the specimen stage is formed by arranging in parallel a plurality of pipelines of different diameters and the flow rate of the coolant to each of the pipelines is controlled by the control means, a desired flow rate can be controlled reliably and briefly, for example, by selecting a pipeline for flowing the coolant in accordance with a required flow rate and, accordingly, the flow can be controlled at a higher accuracy thereby enabling finer temperature control compared with a case of forming the flow channel by one pipeline and controlling the degree of cooling by adjusting the flow rate of the coolant flowing through the pipeline.

In the dry etching method as defined in the first feature of the present invention, since the specimen temperature is changed between etching in one step and etching in a succeeding step, when the main etching is conducted as one step at a normal temperature, while overetching is conducted as the succeeding step at a low temperature for instance, since radical reaction can be suppressed in the overetching even if the thickness of the formed side wall protection film is thin the radical reaction can be suppressed as described above by the temperature lowering, it can withstand excessive radical attack resulted. Accordingly, due to the effect of suppressing the radical reaction by the temperature lowering, even if the bias applied to the specimen is lowered, formation of undercut or notching can be prevented. Thus, it is possible to attain both the high selectivity and ensurance of anisotropic shape, that is, fine fabrication at high accuracy simultaneously.

Further, since each of the etching treatments is conducted in the identical processing apparatus, the time for the changing the specimen temperature between the steps can be shortened. Accordingly, if the change of the specimen temperature is conducted about within a time required for a series of operations, for example, interruption of electric discharge or alternation of etching gases between the steps, dry etching treatment comprising a plurality of steps can be applied without deteriorating the throughput.

In the second feature of the method of dry etching according to the present invention, since etching treatment is conducted at different temperatures between the etching of the initial step and the etching of the final step, the same effect as that in the first feature can be obtained. Further, when the etching of the final step has been completed, since the temperature for the specimen stage is changed previously to a setting temperature for the specimen in the etching of the initial step, before putting the next specimen in the identical processing apparatus, the time from the completion of etching for one specimen to the time starting the etching for the next specimen can be shortened, by which the productivity can be improved.

Further, in the apparatus for producing the semiconductor device according to the present invention, since the coolant comprising a liquefied gas or a gas which can be supplied in a great amount easily is used as the coolant, by which the semiconductor substrate (specimen) on the specimen stage is cooled, the semiconductor substrate can be cooled more rapidly compared with the existent cooling method using the liquid as the coolant and, accordingly, the semiconductor substrate can be controlled to a desired temperature in a short period of time.

Furthermore, since the temperature for the semiconductor substrate can be controlled in a short period of time, it is possible to attain both the high selectivity and ensurance of the anisotropic shape, that is, fine fabrication at high accuracy simultaneously by applying two step etching treatment, that is, main etching at a normal temperature and overetching at a low temperature also, for example, to W polyside having different vapor pressures for reaction products. In addition, since the temperature of the semiconductor substrate can be changed rapidly in a short period of time between the steps, the temperature can be changed about within a time required for a series of operations such as interruption of electric discharge or alteration of etching gases between the steps and, accordingly, the dry etching treatment comprising a plurality of steps can be conducted rapidly without lowering the throughput.

Further, since the flow channel for the coolant to the specimen stage is formed by arranging in parallel a plurality of control pipelines of different diameters and adjusting the flow rate of the coolant to each of the pipelines by a control means, if the control degree of the control means is control, for example, by disposing a feed back control means or data base control means, the flow rate of the coolant supplied to the specimen stage can be controlled reliably and instantaneously to a desired amount and, accordingly, the flow rate can be controlled at a higher accuracy compared with a case of forming the flow channel with one pipeline and controlling the cooling degree by adjusting the flow rate of the coolant flowing through the pipeline, by which finer temperature control is possible to enable higher accuracy for the etching fabrication.

DETAILED DESCRIPTION OF THE PREFERRED EMBODIMENTS

A dry etching method according to the present invention will be explained more in details.

Figure 1A:
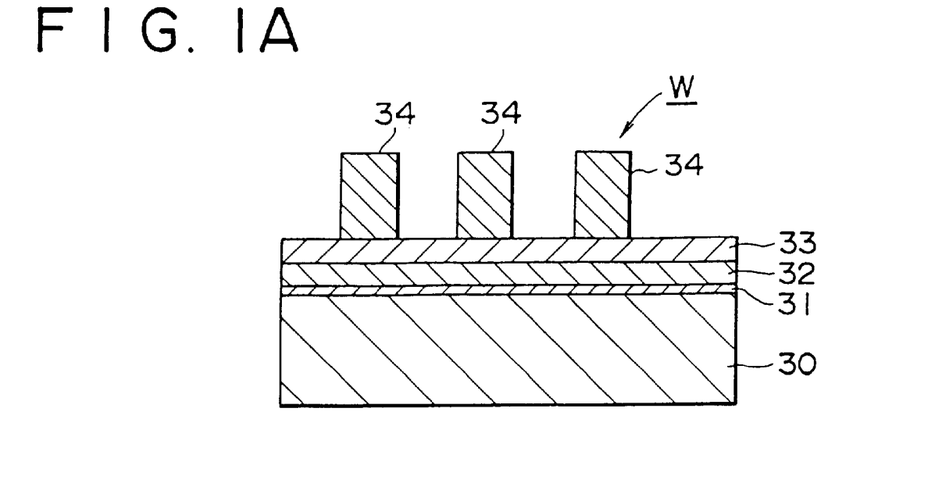
FIGS. 1A–1C are cross sectional side elevational views for a main portion for explaining a first embodiment of a dry etching method according to the present invention in the order of processing.

At first, a first embodiment of the dry etching method according to the present invention will be explained with reference to FIGS. 1A–1C.

This method is an example of applying the method according to the present invention to a method of fabricating a W polyside by a two step etching treatment. That is, as shown in FIG. 1A in this embodiment, a W polyside comprising a polysilicon layer 32 and a WSi$_x$ layer 33 is formed on a SiO$_2$ film 31 on a silicon substrate 30, on which a photo-resist pattern 34 is further formed to prepare a specimen W. The W polyside of the specimen is fabricated by etching into a pattern shape corresponding to the photo-resist pattern 34, in which main etching is applied at a normal temperature as the first step and overetching is applied at a low temperature as the succeeding second step.

Figure 1B:
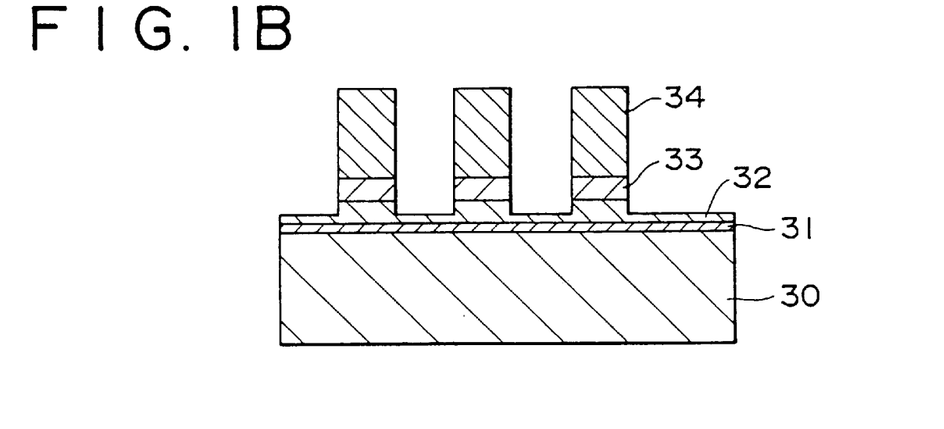

At first, main etching of the first step is applied at a normal temperature (20° C.) under the following conditions to remove the WSi$_x$ layer 33 and the polysilicon layer 32 by etching to a state of partially leaving the polysilicon layer 32 as shown in FIG. 1B.

First Step (Main Etching)

Etching gas: Cl$_2$O$_2$ 50/10 SCCM

Pressure: 5 mTorr

Source power-1 (RF antenna 4): 2500 W (13.56 Hz)

Source power-2 (RF antenna 3,3): 2500 W (13.56 Hz)

RF bias: 100 W

Specimen temperature: 20° C.

For the control of the specimen temperature in this embodiment, a heater (not illustrated) of an electrostatic chuck provided to a stage 12 to be described later and cooling by a chiller 17 are applied in combination, and the specimen temperature is controlled finely by the cooling control of a control device 23.

Then, for applying overetching of the second step succeeding to the first step, electric discharge in the etching device is once disconnected, and gases remaining in a diffusion chamber 2 are exhausted. Then, an etching gas used in the second step to be described later (a gas identical with that in the first step is used in this embodiment) is introduced into the diffusion chamber, and the gas is stabilized and the inside of the diffusion chamber 2 is controlled to a constant pressure. Further, during a series of such operations, that is, directly after the completion of the etching of the first step, an electronic control valve 22 for a by-pass pipeline 21 in the cooling system by the chiller 17 is wholly closed, and an electronic control valve 20 for the coolant pipeline 15 is opened wholly, and the gas coolant at −140° C. from the chiller 17 is supplied to the stage 12 to rapidly cool the specimen W.

Then, the temperature of the specimen W reached −30° C., which is an etching temperature to be described later within a short period of time of about 30 sec by such rapid cooling. In this case, since the series of operations described above, that is, is a series of operations of interrupting discharge, exhausting remaining gases in the diffusion chamber 2 and, further, introducing and stabilizing a fresh etching gas take a time equal with or more than the time required for rapid cooling, the time required for the rapid cooling does not constitute a factor of delaying the time required for the etching treatment of the specimen W.

Figure 1C:
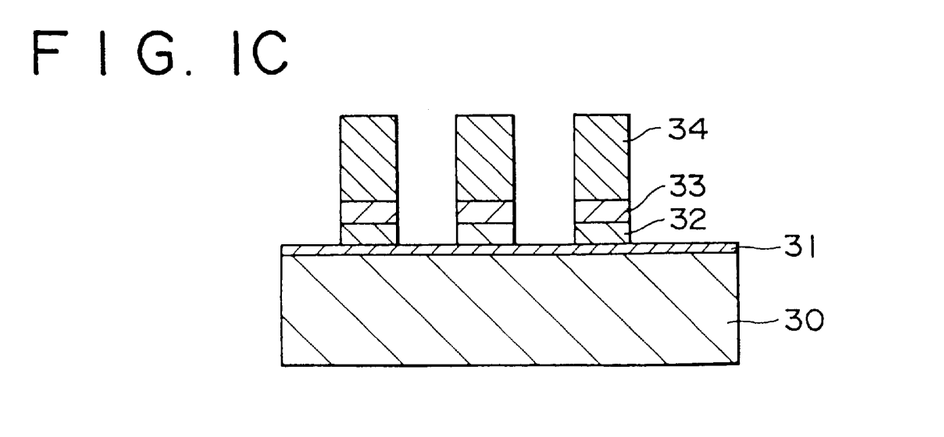

Successively, discharging is applied again to conduct overetching of the second step at a low temperature (−30° C.) under the following conditions, and a portion of a polysilicon layer remaining being disposed on the SiO2 film 32 is removed by etching as shown in FIG. 1C.

Second Step (Overetching)
- Etching gas: $Cl_2O_2$ 50/10 SCCM
- Pressure: 5 mTorr
- Source power-1 (RF antenna 4): 2500 W (13.56 Hz)
- Source power-2 (RF antenna 3): 2500 W (13.56 Hz)
- RF bias: 20 W
- Specimen temperature: −30° C.

When the overetching is thus applied, since the etching is a treatment under the low temperature, radical reactions can be suppressed by the temperature lowering even if the formed side wall protection film is thin and, accordingly, it is possible to withstand excessive radical attack and suppress the occurrence of undercut or notching even if the bias applied to the specimen is lowered from 100 W in the first step to 20 W. Accordingly, sufficient anisotropic shape can be ensured as shown in FIG. 1C while keeping selectivity to higher than 100 with no effect on the shape even under 100% overetching.

In the dry etching method described above, it is possible to attain both the high selectivity and ensurance for the anisotropic shape, that is, fine fabrication at high accuracy and, in addition, the temperature for the specimen can be changed easily and in a short period of time by conducting each of the steps in one identical etching device, so that the temperature can be changed about within a period of time required for a series of operations such as interruption of discharge or alteration of etching gases between the steps and, accordingly, the dry etching treatment comprising a plurality of steps can be applied rapidly without lowering the throughput.

After completing the two steps of etching as described above, when the same treatment is applied continuously and repeatedly in the identical processing device to a next specimen, the stage 12 is controlled to a setting temperature for the specimen in the initial step, the first step in this embodiment after the completion of the second step and taking out the specimen and before putting the next specimen into the diffusion chamber. That is, while the specimen is set to a temperature of −30° C. in the second step in the first embodiment, the stage 12 is heated by a heater of an electrostatic chuck (not illustrated) and, further, the degree of cooling by the chiller 17 is adapted such that the stage is heated rapidly by a method of wholly opening the electronic control valve 22 of the by-pass pipeline 21 while wholly closing the electronic control valve 20 of the coolant pipeline 15, thereby interrupting the supply of the gas coolant from the chiller 17 to the stage 12.

Then, it is possible to shorten the time after the completion of the etching treatment for one specimen to the initiation for the etching treatment for a next specimen. Particularly, if the temperature can be changed to a setting temperature for the specimen in the stage 12 about approximately within a period of time till the new specimen is transported in the diffusion chamber 2, the dry etching treatment comprising a plurality of steps can be applied without lowering the throughput, that is, while ensuring a sufficient productivity.

Figure 2A:
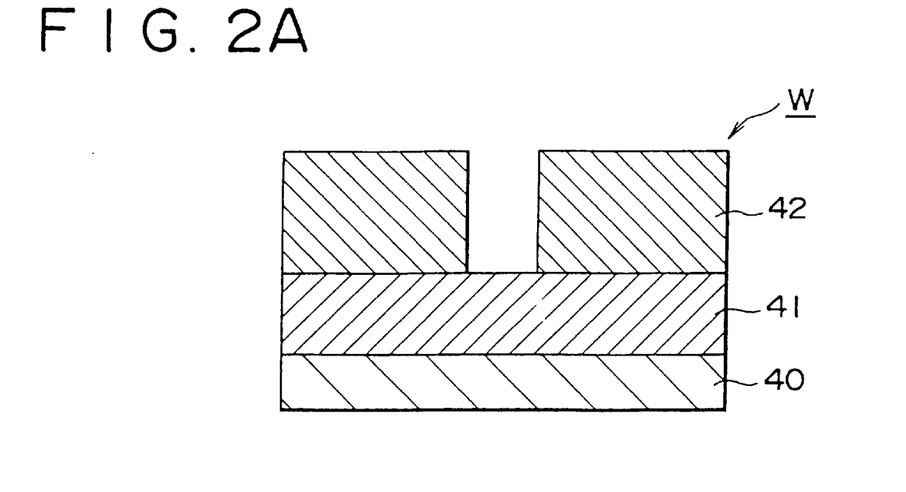
FIGS. 2A–2C are cross sectional side elevational views for a main portion for explaining a second embodiment of the dry etching method according to the present invention in the order of processing.

Then, a second embodiment of the dry etching method according to the present invention using an etching device 1 shown in FIG. 4 will be explained with reference to FIGS. 2A–2C.

This method is an example of applying the method of the present invention to the fabrication of a contact hole by etching. That is, in this embodiment, an $SiO_2$ layer 41 of a specimen W in which a photoresist pattern 42 is formed on an $SiO_2$ layer 41 on a silicon substrate 40 is etched and fabricated into a pattern shape corresponding to the photoresist pattern 42 as shown in FIG. 2A. In this method, just etching is applied at a normal temperature as the first step (main etching) and then overetching is applied at a low temperature as the succeeding second step.

Figure 2B:
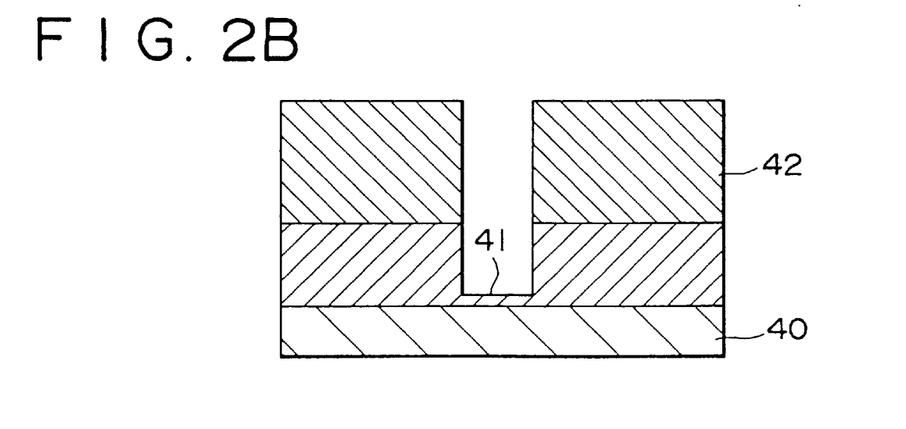

At first, just etching of the first step is applied under the following conditions and the $SiO_2$ layer 41 is removed by etching to a state of leaving a portion to form a thin film as shown in FIG. 2B.

First Step (Just etching)
- Etching gas: $Cl_4F_8O_2$ 50/10 SCCM
- Pressure: 5 mTorr
- Source power-1 (RF antenna 4): 2500 W (13.56 Hz)
- Source power-2 (RF antenna 3,3): 2500 W (13.56 Hz)
- Pulse: ON/OFF; 10 msec/30 msec
- RF bias: 500 W
- Specimen temperature: −20° C.

Also in this embodiment, the specimen temperature is controlled by the combined use of a heater of an electrostatic chuck equipped in the stage 12 (not illustrated) and cooling by the chiller 17 in the same manner as in the first embodiment and, particularly, the specimen temperature is finely controlled by cooling control by the control device 23 described above.

Then, for applying overetching of the second step succeeding to the first step, discharging in the etching device 1 is once interrupted and the gases remaining in the diffusion chamber 2 are exhausted from the exhaust port 13. Then, an etching gas used for the second step described later (gas identical with that in the first step is used also in this embodiment) is introduced into the diffusion chamber 2, and the gas is stabilized to adjust the inside of the diffusion chamber 2 to a constant pressure. Further, during a series of operations described above, that is, immediately after the completion of the etching of the first step, the electronic control valve 22 of the bypass pipeline 21 is wholly closed and the electronic control valve 20 of the coolant pipeline 15 is wholly opened in the cooling system by the chiller 17, to supply the gas coolant at −140° C. from the chiller 17 to the stage 12 to rapidly cool the specimen W.

Then, the temperature of the specimen W reaches −50° C. which is an etching temperature to be described later within a short period of time of about 30 sec by such rapid cooling, like that in the first embodiment. Accordingly, since a series of operations of exhausting remaining gases in the diffusion chamber 2 after the interruption of discharge and further introducing and stabilizing a fresh etching gas takes a longer time than that required for rapid cooling also in this second embodiment, the time required for the rapid cooling does not constitute a factor of delaying the time required for the etching of the specimen W.

Figure 2C:
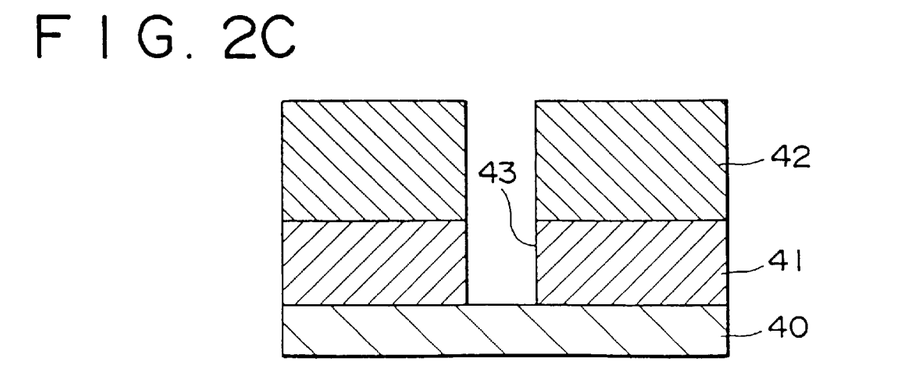

Successively, overetching of the second step at a low temperature (−50° C.) is applied under the following conditions by conducting discharging again, and a portion of the $SiO_2$ layer 41 remaining being exposed on the silicon substrate 40 is removed by etching to form a contact hole 43 as shown in FIG. 2C.

Second Step (Overetching)
   Etching gas: $Cl_4F_8O_2$ 50/10 SCCM
   Pressure: 5 mTorr
   Source power-1 (RF antenna 4): 2500 W (13.56 Hz)
   Source power-2 (RF antenna 3,3): 2500 W (13.56 Hz)
   Pulse: ON/OFF; 10 msec/30 msec
   RF bias: 200 W
   Specimen temperature: −50° C.

When the overetching is thus applied, since the etching is a treatment under cooling to a low temperature, radical reaction can be suppressed by the temperature lowering even if the formed side wall protection film is thin, and accordingly, it is possible to withstand excessive radical attack and suppress the occurrence of undercut or notching even if the bias applied to the specimen is lowered from 500 W in the first step to 200 W. Accordingly, if the temperature is lowered, for example, already from the just etching of the first step, an organic polymer is deposited to the side wall of the contact hole to be formed to make the contact hole into a tapered shape, and no fine hole opening can not be formed. On the contrary, if the temperature is lowered only for the overetching as in this embodiment, the foregoing problem can be solved and the contact hole 43 having a sufficient anisotropic shape as shown in FIG. 2C can be formed at a good reproducibility while ensuring 100 or higher selectivity relative to the silicon substrate 40.

Accordingly, it is possible also in this dry etching method, to attain both high selectivity and ensurance for the anisotropic shape, that is, fine fabrication at a high accuracy, and the dry etching treatment comprising a plurality of steps can be applied without lowering the throughput.

After the completion of the two step etching treatment, also in this case, when the same treatment is applied to a next specimen continuously and repeatedly in the identical processing device, if the stage 12 is controlled to the setting temperature for the specimen in the initial step, the first step in this case after completing the second step and taking out the specimen after treatment, before putting the next specimen into the diffusion chamber 2 the dry etching treatment comprising a plurality of steps can be conducted like that in the previous two embodiments without lowering the throughput while keeping the sufficient efficiency for the productivity.

Figure 3A:
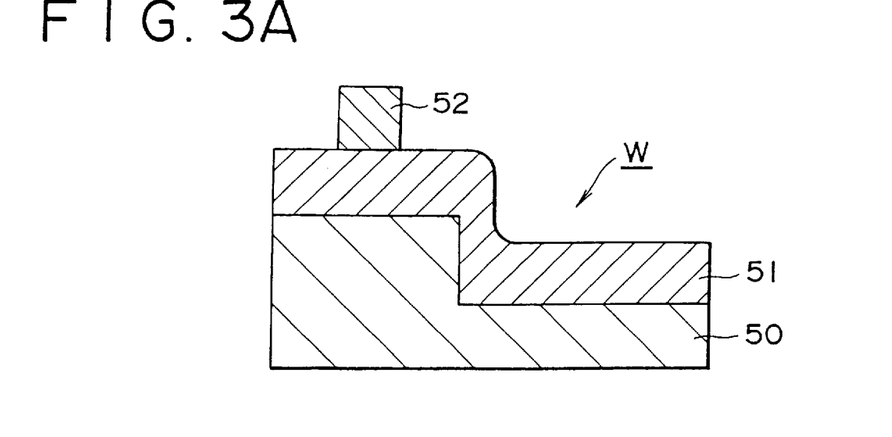
FIGS. 3A–3C are cross sectional side elevational views for a main portion for explaining a third embodiment of the dry etching method according to the present invention in the order of processing.

Then, a third embodiment of the dry etching method according to the present invention will be explained with reference to FIGS. 3A–3C.

This method is an example of applying the method according to the present invention to a method of fabricating polysilicon on an $SiO_2$ layer having a high step. That is, in this embodiment, a specimen W has an SiO2 layer 50 having a high step formed on a silicon substrate (not illustrated), on which polysilicon layer 51 is formed and a photoresist pattern 52 is formed further thereover, and the polysilicon layer 51 is etched and fabricated into a pattern shape corresponding to the photoresist pattern 52. Main etching is applied at a low temperature as a first step and overetching is applied at a high temperature as a successive second step.

Figure 4:
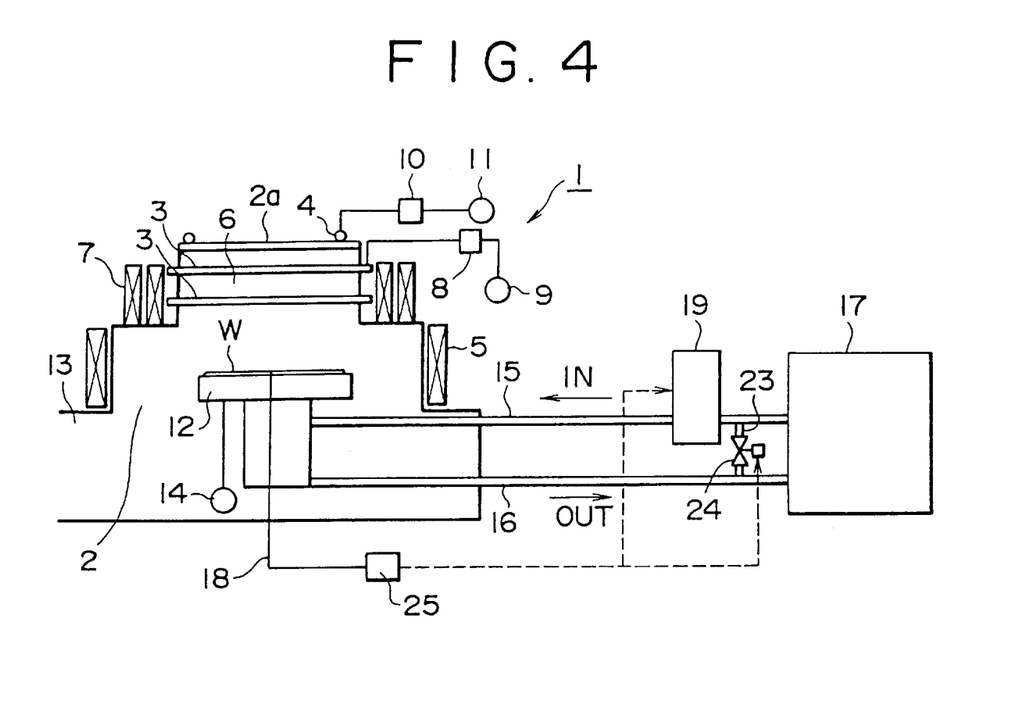
FIG. 4 is a schematic constitutional view illustrating one embodiment of applying the apparatus for producing the semiconductor device according to the present invention to a plasma etching apparatus.

In this embodiment, an ECR type etcher (not illustrated) is used as the etching apparatus, the apparatus comprising the cooling means and control mechanisms therefor in the etching apparatus 1 shown in FIG. 4, that is, coolant pipelines 15, 16, a chiller 17, a fluorescence fiber thermometer 18, a control device, electronic control valves 20, 22, a bypass pipeline 21, a control device 23 and a stage 12.

Figure 3B:
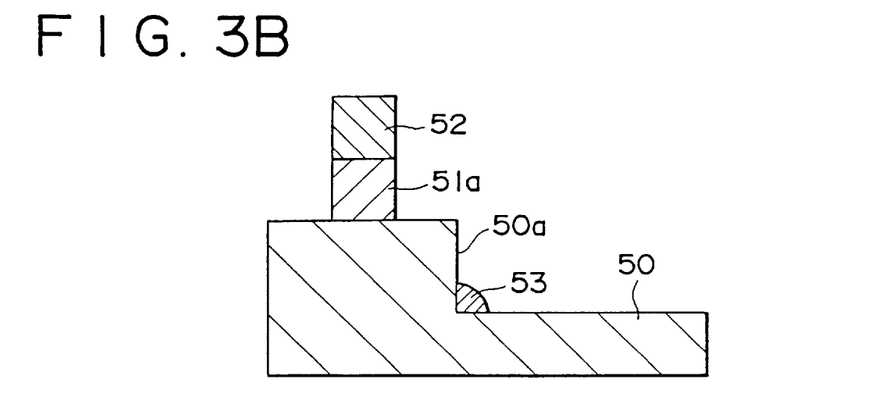

At first, main etching of the first step is applied under the following conditions and the polysilicon layer 51 is removed by etching as shown in FIG. 3(b).

First Step 1 (Main etching)
   Etching gas: Cl2/O2 90/10 SCCM
   Pressure: 10 mTorr
   microwave power: 850 W
   RF bias: 100 W
   Specimen temperature: −30° C.

With such an etching treatment, since the etching is low temperature etching at a specimen temperature of −30° C., a firm side wall protection film is formed to an etching pattern 51a formed from the polysilicon layer 51. In this case, at the step 50a of the $SiO_2$ layer 50, since the thickness of the polysilicon layer 51 formed therein is greater than that of other positions, a stringer (etching residue) 53 not removed by etching is formed.

The specimen temperature is controlled in this embodiment in the same manner as that in the second step of the first and the second embodiment.

Then, for applying overetching of the second step succeeding to the first step, the control mechanism for the cooling means and the heater disposed to the stage 12 are controlled to rapidly heat the specimen W.

Then, the temperature of the specimen W reaches 50° C. which is an etching temperature to be described later within a short period of time of about 50 sec. Accordingly, also in the third embodiment, the time required for the rapid heating does not form a factor for delaying the time required for the etching treatment of the specimen W.

Figure 3C:
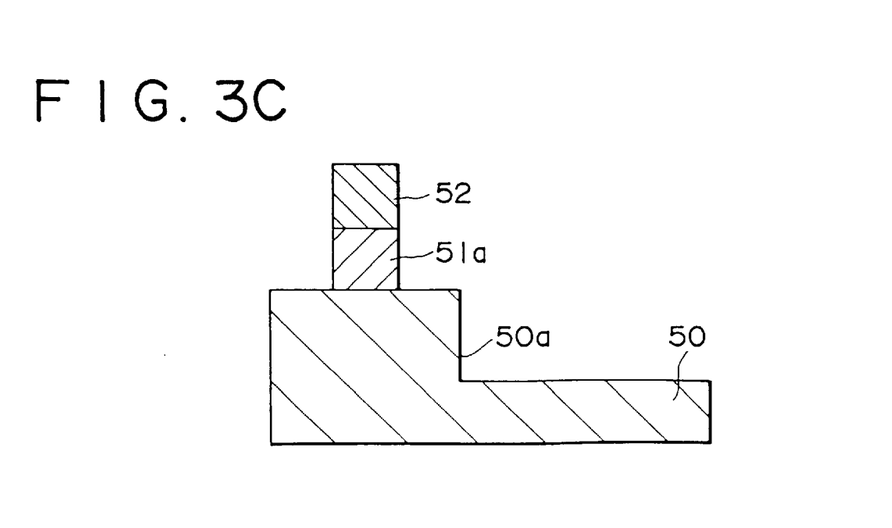

Successively, discharging is conducted again to apply overetching of the second step at a high temperature (50° C.) under the following conditions, and a stringer (etching residue) 53 formed at the step 50a of the $SiO_2$ layer 50 is removed as shown in FIG. 3C.

Second Step 1 (overetcing)
   Etching gas: $Cl_2$ 100 SCCM
   Pressure: 10 mTorr
   lwave power: 850 W
   RF bias: 50 W
   Specimen temperature: 50° C.

When such overetching is applied, since radical reaction is promoted by increasing the specimen temperature (50° C.), the stringer 53 formed at the stepped portion 50a can be removed easily. Further, since a firm side wall protection film is formed on the side wall of the etching pattern 51a since it is subjected to the low temperature etching in the first step, the overetching gives no undesired effect on the shape.

Accordingly, also in this dry etching method, it is possible to attain both the high selectivity and ensurance of the anisotropic shape, that is, fine fabrication at a high accuracy like that in the first and the second embodiments, and dry etching treatment comprising a plurality of steps can be applied without lowering the throughput.

Also in a case of applying the same treatment continuously and repeatedly in the identical processing device to a next specimen after the completion of the two steps of the etching treatment, the dry etching treatment comprising a plurality of steps can be applied without lowering the throughput while ensuring a sufficient productivity efficiency by controlling the stage to a setting temperature for the specimen in the initial step, the first step in this embodiment after completing the second step and taking out the specimen and before putting the next specimen into the chamber.

Further, in the foregoing embodiment, while all the etching treatment comprise two steps, the present invention is not restricted only thereto but the etching treatment can be applied with no restriction thereto by three or more steps.

Further, when the first step is a main etching or just etching applied at a normal temperature, and the second step succeeding thereto is overetching applied at a low temperature, the specimen after the first step may be subjected to $O_2$ plasma treatment or $N_2$ plasma treatment in the identical processing device between the steps.

When such plasma treatment is applied, the etching pattern of the specimen is oxidized or nitrided on the side wall thereof, and firm oxides or nitrides are formed on the side wall, so that it is possible, upon overetching at a low temperature to be applied subsequently, to avoid excess etching of the etching pattern which would make the shape of the etching pattern obtained finally greatly different from the desired shape, and the anisotropic shape can be ensured more reliably.

Then, the apparatus for manufacturing a semiconductor device according to the present invention will be explained more in details referring to the drawings.

FIG. 4 is a view illustrating an embodiment in which an apparatus for manufacturing a semiconductor device according to the present invention is applied to a plasma etching apparatus and reference numeral 1 in FIG. 4 represents a plasma etching apparatus (hereinafter simply referred to as etching apparatus).

The etching apparatus 1 comprises a helicon wave plasma generation source comprising RF antennas disposed at two positions and a vertically movable stage and has a diffusion chamber (vacuum chamber) 2, RF antennas 3, 3 disposed above the diffusion chamber 2 an RF antenna 4 formed in a loop on a ceiling 2a of the diffusion chamber 2 and a multi-pole magnet 5 forming cusped magnetic fields disposed to the lower outside of the diffusion chamber 2 for suppressing elimination of electrons on the wall. The RF antennas 3, 3 are disposed around the outside of a bell jar made of a cylindrical quartz tube of 350 mm diameter formed above the diffusion chamber 2 which has an antenna shape of establishing plasmas at a mode: M=1. Solenoid coil assembly 7 comprising an inner circumference coils and outer circumference coils is disposed to the outside of the RF antennas 3, 3. Of the solenoid coil assembly 7, the inner circumference coils contribute to the propagation of the helicon wave, while the outer circumferential coils contribute to the transportation of formed plasmas. Further, a power source 9 is connected to the RF antennas 3, 3 by way of a matching network 8 and a power source 11 is connected by way of a matching network 10 to the RF antenna 4.

Further, in the diffusion chamber 2, a stage (specimen table) 12 for supporting and fixing the specimen w comprising a semiconductor substrate such as a wafer is disposed, and an exhaustion port 13 is connected to a negative pressure means such as a vacuum pump (not illustrated) and formed for exhausting the gas in the diffusion chamber 2. The stage 12 comprises an elevating mechanism for vertically moving the specimen W (not illustrated) and a wafer adhesion mechanism (not illustrated) by an electrostatic chuck having a heater, which is connected with a bias power source 14 for controlling incident ion energy to the specimen W.

Further, a chiller 17 is connected by way of coolant pipelines 15, 16 to the stage 12 and, further, a fluorescent fiber thermometer (temperature detection means) 18 is connected for measuring the temperature of the specimen W. The chiller 17 is adapted to supply a gas coolant (refrigerant) at −140° C., for example, made of FURON by way of a coolant pipeline 15 to the stage 12, and receive the gas coolant returned by way of the coolant pipeline 16 from the stage 12 and further cools the coolant to a predetermined temperature, and adapted to cool the specimen W supported and fixed on the stage 12 by the circulation of the gas coolant.

Figure 5:
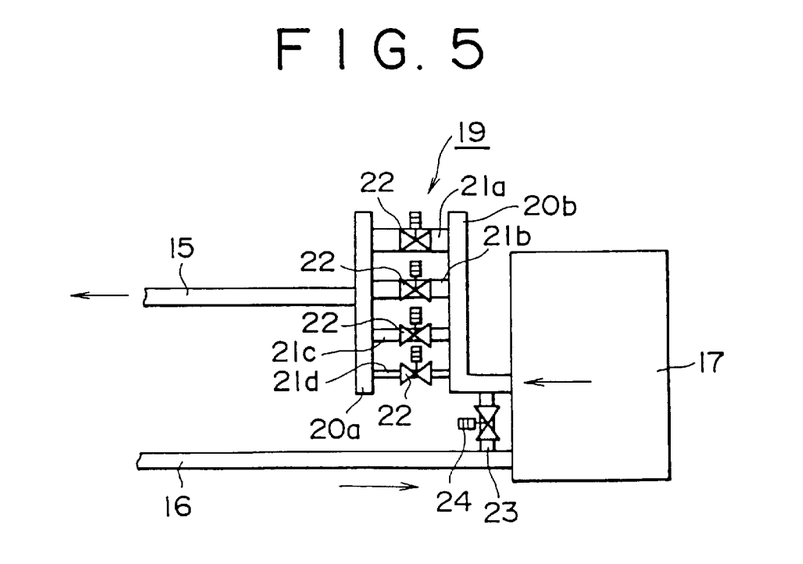
FIG. 5 is a schematic constitutional view for a cooling control section and a periphery thereof.

A cooling degree control section 19 is disposed between the coolant pipeline 15 and the chiller 17. The cooling control section 15 comprises, as shown in FIG. 5, a connection pipe 20a connected to the coolant pipeline 15, a connection pipe 20b connected to the chiller 17, a plurality of control pipelines 21a–21d disposed between the connection pipes 20a, 20b, and a cryogenic valve 22 disposed to each of the control pipelines 21a–21d. All of the control pipelines 21a–21d are formed so as to have inner diameter different from each other, and the inner diameter for each of them is adjusted such that a predetermined amount of gas coolant can be supplied from the chiller 17 to the stage 12. That is, the flow rate of the gas coolant flowing in the controlling pipelines 21a–21d is determined depending on the pressure of the gas coolant supplied from the chiller 17 and the opening area of the control pipelines 21a–21d determined by the inner diameter, by which a flow rate per predetermined period of time is determined.

Each of the cryogenic valve 22, . . . is adapted to take two positions of full opening and full closure in this embodiment such that a gas coolant at a flow rate determined by the inner diameter of the control pipeline to which the valve is disposed is supplied into the coolant pipeline 15 upon whole opening, while the supply of the gas coolant from the control pipeline disposed thereto is interrupted upon whole enclosure.

Further, a by-pass pipeline 23 is disposed between the connection pipe 20b and the coolant pipeline 16 in the cooling control section 19, and a cryogenic valve 24 is disposed to the by-pass pipeline 23. The bypass pipeline 23 forms a flow channel for returning a portion of the gas coolant flowing from the chiller 17 to the connection pipe 20b by way of the coolant pipeline 16 to the chiller 17, and the cryogenic valve 24 is adapted to control the amount of the gas coolant returned to the chiller 17 by way of the coolant pipeline 16. Accordingly, the cryogenic valve 24 is adapted to determine the total amount of the gas coolant flowing passing through the connection pipe 20b to the control pipelines 21a–21d.

Then, the cooling means in the present invention comprises the chiller 17, the connection pipes 20a, 20b, control pipelines 21a, 21d in the cooling control section 19 and coolant pipeline 15b, and the control means in the present invention comprises the cryogenic valves 22, . . . and the cryogenic valves 24.

The cooling degree for the specimen W is controlled by the flow rate of the coolant supplied from the chiller 17. That is, for cooling the stage 12 thereby cooling the specimen W to the desired temperature, the temperature sensed by the fluorescent fiber thermometer 18 is detected by a feed back control device (feed back control means) 25 comprising a PID controller and the feed back control device 25 controls the ON-OFF or ON-OFF degree of the cryogenic valve 21, . . . , 23 so as to obtain a gas coolant flow rate previously determined by experiment or calculation based on the difference between the detected temperature and the predetermined temperature for the specimen W.

In FIG. 4, details for the apparatus such as an etching gas introduction port and a gate valve are not illustrated.

What is claimed is:

1. An apparatus for manufacturing a semiconductor device comprising:

a vacuum chamber in which a specimen stage having a cooling means is disposed; and plasma generation means for generating plasmas in the vacuum chamber, in which plasmas are generated to treat the semiconductor substrate while controlling the temperature of the substrate placed on the specimen stage by cooling said specimen stage by said cooling means, wherein, said cooling means uses a gas as a coolant, and a flow channel of the coolant is formed by arranging in parallel a plurality of pipelines having diameters different from each other at a position before flowing to said specimen stage, and the specimen stage is cooled by flowing said coolant through the pipeline to the specimen stage, and the cooling means is provided with a control means for controlling the amount of the coolant flown to each of said plurality of pipelines.

2. An apparatus for manufacturing a semiconductor device as defined in claim 1, wherein temperature detection means is operatively disposed with respect to said specimen stage for detecting the temperature of a semiconductor substrate placed thereon, the temperature detection means is connected with a feed back control means for receiving the output signal based on the detected temperature and controlling the control degree of said control means so as to maintain the temperature of said semiconductor substrate to a predetermined temperature.

3. An apparatus for manufacturing a semiconductor device as defined in claim 1, wherein heating means is operatively, disposed with respect to said specimen stage for controlling the temperature of the semiconductor substrate placed on the specimen stage by elevating the temperature of the specimen stage.

4. An apparatus for manufacturing a semiconductor device as defined in claim 1, wherein data base control means is operatively connected to said control means for controlling the controlling amount by the control means based on the amount of input heat applied to said semiconductor substrate in accordance with plasma density generated n said plasma generation means and ion acceleration voltage.

5. The apparatus of claim 1, wherein the coolant is a liquefied gas.

6. An apparatus for manufacturing a semiconductor device comprising:

a vacuum chamber in which a specimen stage having a cooling means is disposed; and a plasma generation means for generating plasmas in the vacuum chamber in which plasmas are generated to treat said semiconductor substrate while controlling the temperature of the substrate placed on the specimen stage by cooling the temperature of said specimen stage by said cooling means, wherein, the cooling means uses a gas as a coolant and cools the specimen stage by flowing the coolant to the specimen stage, and the cooling means has a baffle plate disposed in a pipeline flow channel of the coolant for changing the unobstructed cross sectional area of the pipeline thereby controlling the amount of the coolant flowing through the pipeline.

7. The apparatus of claim 6, wherein said coolant is a liquefied gas.

* * * * *